US012514037B2

(12) United States Patent
Wei

(10) Patent No.: US 12,514,037 B2
(45) Date of Patent: Dec. 30, 2025

(54) LED CHIP, DISPLAY PANEL THEREOF, AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Wei Wei, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 792 days.

(21) Appl. No.: 17/758,018

(22) PCT Filed: May 31, 2022

(86) PCT No.: PCT/CN2022/096441

§ 371 (c)(1),
(2) Date: Jun. 26, 2022

(87) PCT Pub. No.: WO2023/221179

PCT Pub. Date: Nov. 23, 2023

(65) Prior Publication Data

US 2024/0194833 A1 Jun. 13, 2024

(30) Foreign Application Priority Data

May 19, 2022 (CN) ........................ 202210553042.2

(51) Int. Cl.
*H10H 20/85* (2025.01)
*H01L 25/16* (2023.01)

(52) U.S. Cl.
CPC ....... *H10H 20/8506* (2025.01); *H01L 25/167* (2013.01)

(58) Field of Classification Search
CPC combination set(s) only.
See application file for complete search history.

(56) References Cited

U.S. PATENT DOCUMENTS 6,204,545 B1 * 3/2001 Nakata .................. H10D 8/045 257/466
8,395,568 B2 * 3/2013 Ray ........................ H10F 19/50 345/82

(Continued)

FOREIGN PATENT DOCUMENTS

CN 111108612 A 5/2020
CN 211125685 U 7/2020

(Continued)

OTHER PUBLICATIONS

International Search Report in International application No. PCT/CN2022/096441, mailed on Dec. 22, 2022.

(Continued)

*Primary Examiner* — Mark W Tornow
*Assistant Examiner* — Priya M Rampersaud
(74) *Attorney, Agent, or Firm* — PV IP PC; Wei Te Chung

(57) ABSTRACT

The present application provides a light emitting diode (LED) chip, a display panel thereof, and a manufacturing method thereof. The display panel includes a plurality of LED light emitting devices, a plurality of first electrodes and a plurality of second electrodes. The LED light emitting device includes a central support element and a conductive portion covering a surface of the semiconductor layer. The conductive portion is electrically connected to the first electrode, a side surface of the conductive portion away from semiconductor layer is a spherical surface. A conduc- (Continued)

tive cross-section is disposed on the semiconductor layer and configure to cut the spherical surface. A third electrode is disposed on the conductive cross-section and is electrically connected to the second electrode.

16 Claims, 11 Drawing Sheets

(56) References Cited

U.S. PATENT DOCUMENTS

| | | | | |
|---|---|---|---|---|
| 2002/0109074 | A1* | 8/2002 | Uchida | H10F 30/223 257/E31.038 |
| 2004/0228131 | A1 | 11/2004 | Minano et al. | |
| 2005/0067622 | A1* | 3/2005 | Nakata | H10F 19/40 257/E29.022 |
| 2005/0127379 | A1* | 6/2005 | Nakata | H02S 40/22 438/69 |
| 2007/0169804 | A1* | 7/2007 | Nakata | H10F 77/147 136/250 |
| 2013/0145588 | A1* | 6/2013 | Nakata | D03J 1/00 29/25.01 |
| 2013/0153027 | A1* | 6/2013 | Youngbull | H10F 10/14 438/69 |
| 2021/0296532 | A1* | 9/2021 | Tang | H10H 20/832 |
| 2021/0296533 | A1* | 9/2021 | Tang | H10H 20/01 |

FOREIGN PATENT DOCUMENTS

| | | | |
|---|---|---|---|
| CN | 111540815 | A | 8/2020 |
| CN | 111540819 | A | 8/2020 |
| CN | 113707787 | A | 11/2021 |
| JP | 2009094213 | A | 4/2009 |
| JP | 2021071595 | A | 5/2021 |
| WO | 2021189775 | A1 | 9/2021 |

OTHER PUBLICATIONS

Written Opinion of the International Search Authority in International application No. PCT/CN2022/096441, mailed on Dec. 22, 2022.

Chinese Office Action issued in corresponding Chinese Patent Application No. 202210553042.2 dated Mar. 18, 2025, pp. 1-8.

* cited by examiner

LED CHIP, DISPLAY PANEL THEREOF, AND MANUFACTURING METHOD THEREOF

FIELD OF INVENTION

The present application relates to a field of display technologies, especially to a light emitting diode (LED) chip, a display panel thereof, and a manufacturing method thereof.

BACKGROUND OF INVENTION

A micro light emitting diode (LED) display technology refers to a display technology using LEDs in a self-luminous micron scale as light emitting pixel units and assembling and driving the LEDs on a display panel to form a LED array of a high density. One important factor affecting a Micro-LED chip extensively applied to display panels is a mass transfer technology of the Micro-LED chip. A conventional Micro-LED chip mass transfer technology either fails to improve an efficiency under a guaranteed yield rate, or has a low yield rate under a comparatively high efficiency.

Although a "fluid transfer technology" can use a carrying ability of fluid and quickly carry the Micro-LED chip to a target position by loading the Micro-LED chip onto fluid to improve a transfer efficiency to a certain degree. However, because the Micro-LED chip is a two-dimensional thin film lamination structure of a multi-layer, a self-alignment of the Micro-LED chip is not ideal. Also, the fluid itself can carry and cover the aligned Micro-LED chip out from the target position such that the Micro-LED chip is misaligned, which causes a poor transfer yield rate of the Micro-LED chip.

SUMMARY OF INVENTION

Technical Issue

The conventional Micro-LED chip mass transfer technology uses "fluid transfer technology" to improve a transfer rate but causes a technical issue of a poor transfer yield rate.

To solve the above technical issue, technical solutions provided by the present application are as follows:

The present application provides a light emitting diode (LED) chip, including:

a central support element;

a semiconductor layer covering a surface of the central support element; and a conductive portion covering a surface of the semiconductor layer;

wherein a side surface of the conductive portion away from the semiconductor layer is a spherical surface.

The present application further provides a display panel manufacturing method, including:

providing a target substrate, wherein a plurality of first electrodes and a plurality of second electrodes are disposed on the target substrate in an array;

forming a pixel definition layer on the target substrate, wherein the pixel definition layer includes a plurality of sliding slots and a plurality of positioning recesses, the sliding slots are connected to the positioning recesses at least along a direction, and the first electrodes corresponds to the positioning recesses;

providing the above LED chips; and tilting the target substrate, sliding off the LED chips along a surface of the pixel definition layer such that all of the LED chips are slide into the positioning recesses; and forming a conductive cross-section on the LED chip, forming a third electrode contacting the semiconductor layer on the conductive cross-section, and electrically connecting the second electrode to the third electrode.

The present application further provides a display panel made by the above display panel manufacturing method, wherein the display panel includes:

a target substrate including a plurality of first electrodes and a plurality of second electrodes arranged in an array;

a pixel definition layer disposed on the target substrate, wherein the pixel definition layer includes a plurality of positioning recesses arranged in an array, and the first electrodes correspond to the positioning recesses; and a plurality of LED light emitting devices disposed in the positioning recesses, wherein the LED light emitting device includes a central support element, a semiconductor layer covering a surface of the central support element, and a conductive portion covering a surface of the semiconductor layer, and the conductive portion is electrically connected to the first electrode;

wherein a side surface of the conductive portion away from the semiconductor layer is a spherical surface, a conductive cross-section is disposed on the semiconductor layer and is configured to cut the spherical surface, and a third electrode is disposed on the conductive cross-section and is electrically connected to the second electrode.

Advantages

The present application sets the LED chip by layers of the semiconductor layer and the conductive portion sequentially covering the central support element from internal to external such that an appearance of the LED chip is spherical to have excellent fluidity. Therefore, the spherical LED chip can be rolled on the target substrate until falling into the target position, and then become a LED light emitting device with complete functions after later processes, which achieves a highly efficient mass transfer process of the LED chip. Furthermore, no issue of fluid carrying, covering and misaligning the LED chip exists in such process such that it has a higher transfer yield rate.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

REFERENCE NUMBER INDICATION

Figure 1:
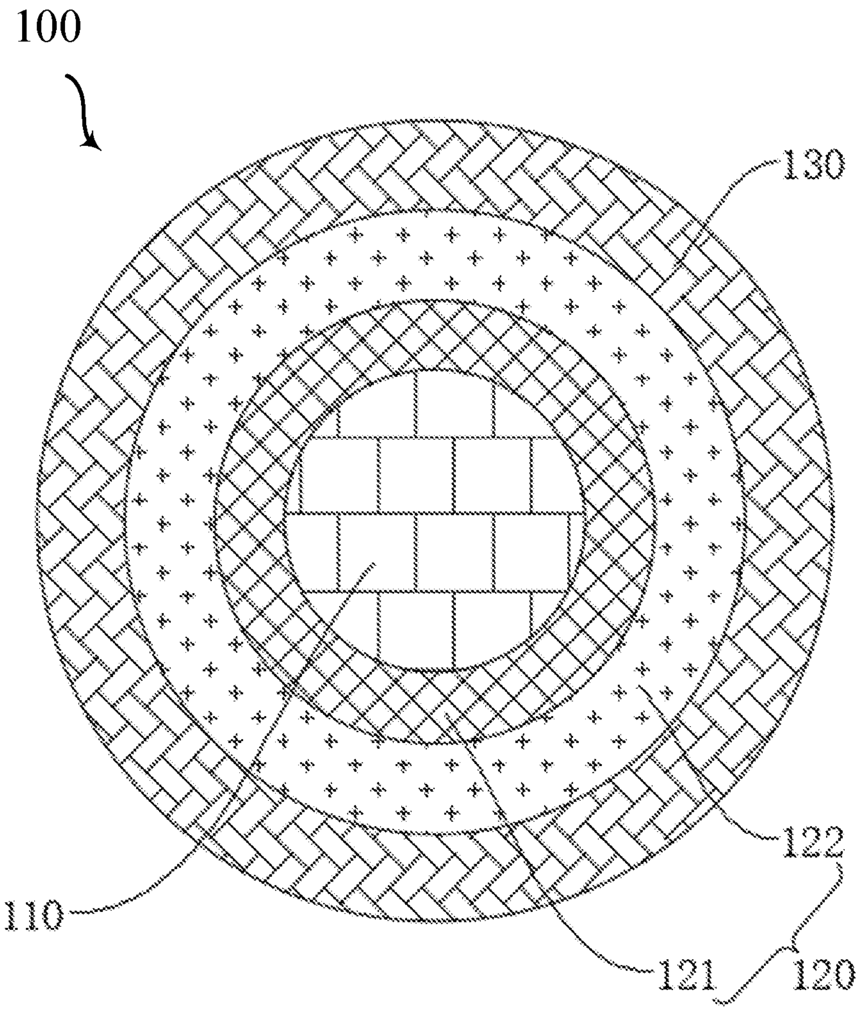
FIG. 1 is a schematic structural view of an entire light emitting diode (LED) chip of the present application.

100, LED chip; 110, central support element; 111, main body portion; 112, electromagnetic portion; 120, semiconductor layer; 121, N-type semiconductor material layer; 122, P-type semiconductor material layer; 130, conductive portion; 200, target substrate; 300, pixel definition layer; 310, positioning recesses; 320, sliding slots; 400, LED light emitting devices; 410, first electrodes; 420, second electrodes; 430, conductive cross-section; 440, third electrode; 450, conductive adhesive layer; 460, metal bonding jumper.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as “upper” and “lower”, when not specified to the contrary explanation, usually refer to the upper and lower states of the device in actual use or working conditions, specifically according to the direction of the figures in the drawings. Furthermore, “inner” and “outer” refer to the outline of the device.

A micro light emitting diode (LED) display technology refers to a display technology using LEDs in a self-luminous micron scale as light emitting pixel units and assembling and driving the LEDs on a display panel to form a high density LED array. A Micro-LED chip has advantages of small size, high integration, and self-luminescence and has better superiority in aspects of brightness, resolution, contrast, power consumption, use lifespan, responsive time, and thermal stability. At present, one important factor affecting a Micro-LED chip extensively applied to display panels is a mass transfer technology of the Micro-LED chip. A conventional Micro-LED chip mass transfer technology either fails to improve an efficiency under a guaranteed yield rate, or has a low yield rate under a comparatively high efficiency.

Although a “fluid transfer technology” can use a carrying ability of fluid and fast carry the Micro-LED chip to a target position by loading the Micro-LED chip onto fluid to improve a transfer efficiency in a certain degree. However, because the Micro-LED chip is a two dimensional thin film lamination structure of a multi-layer, a self-alignment of the Micro-LED chip is not ideal. Also, the fluid itself can carry and cover the aligned Micro-LED chip out from the target position such that the Micro-LED chip is misaligned, which causes a poor transfer yield rate of the Micro-LED chip. The present application sets forth the following solution based on the above technical issue.

Figure 2:
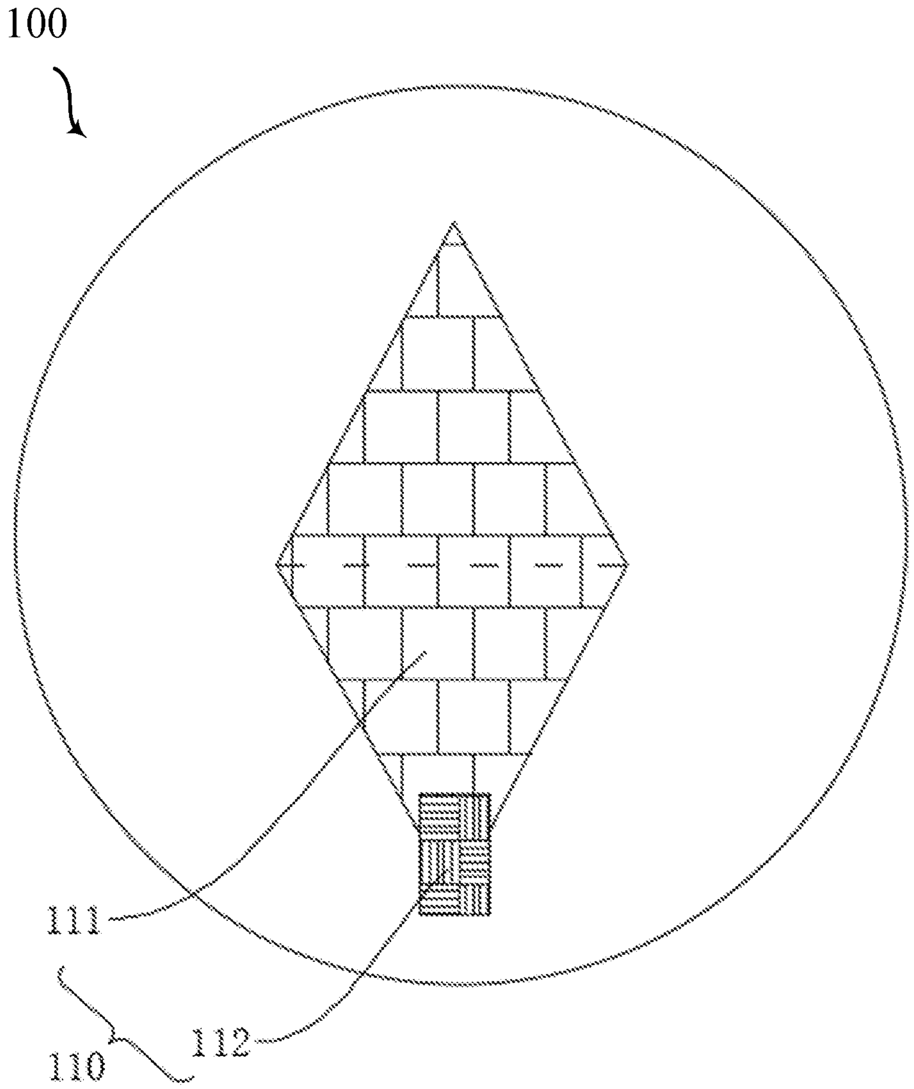
FIG. 2 is a schematic structural view of a central support element of the LED chip of the present application.

With reference to FIGS. 1 and 2, FIG. 1 is a schematic structural view of an entire light emitting diode (LED) chip of the present application. The present application provides a LED chip 100, includes a central support element 110, a semiconductor layer 120 covering a surface of the central support element 110, and a conductive portion 130 covering a surface of the semiconductor layer 120. A side surface of the conductive portion 130 away from the semiconductor layer 120 is a spherical surface.

The present application sets the LED chip 100 by layers of the semiconductor layer 120 and the conductive portion 130 sequentially covering the central support element 110 from internal to external such that an appearance of the LED chip 100 is spherical to have excellent fluidity. Therefore, the spherical LED chip 100 can be rolled on the target substrate 200 until falling into the target position, and then become a LED light emitting device 400 with complete functions after later processes, which achieves a highly efficient mass transfer process of the LED chip 100. Furthermore, no issue of fluid carrying, covering and misaligning the LED chip 100 exists in such process such that it has a higher transfer yield rate.

Technical solutions of the present application are described with specific embodiments now. It should be explained that a descriptive order of the following embodiments has no limit to a preference order of the embodiment.

In the present embodiment, the LED chip 100 can be a common LED, and can be a mini-LED, micro-LED, etc., a difference therebetween is only in a size, and the embodiment of the present application has no specific limit thereto.

In the present embodiment, the central support element 110 can be a spherical surface structure or a sphere-like structure. The sphere-like structure can include but is not limited to an ellipsoid, a double-cone structure symmetrical to a vertical surface, etc.

In the present embodiment, a material of the central support element 110 can be an inorganic insulation material, for example, an alumina crystal material.

In the present embodiment, the semiconductor layer 120 can include a N-type semiconductor material layer 121 covering the surface of the central support element 110 and a P-type semiconductor material layer 122 covering a surface of the N-type semiconductor material layer 121. Semiconductor materials of the N-type semiconductor material layer 121 and the P-type semiconductor material layer 122 can be gallium nitride (GaN) crystal material.

In the present embodiment, the conductive portion 130 can be a conductive film material or a conductive metal material. The conductive film material can be an indium tin oxide (ITO) material. At this time, the conductive portion 130 is a transparent conductive thin film layer. or the conductive metal material can be a conductive metal layer such as an opaque copper metal layer, an aluminum metal layer, a silver metal layer, etc.

In the present embodiment, the conductive portion 130 can be made of an opaque conductive metal material such that the conductive portion 130 can serve as a reflection layer on a surface of the LED chip 100 to reflect and concentrate light emitted from the LED chip 100, which reduce leakage light of a side surface of the LED chip 100 such that display brightness of the display panel along the light exiting direction can be improved.

With reference to FIG. 2, FIG. 2 is a schematic structural view of the central support element 110 of the LED chip of the present application. In the LED chip 100 of the present application, the central support element 110 can include a main body portion 111 and an electromagnetic portion 112. The main body portion 111 includes two cone segments disposed symmetrically. In particular, the cone segments can be a cone structure of alumina crystal, and bottom surfaces of the two cone structure of alumina crystals coincide with each other and vertices of the two alumina crystals are disposed away from each other.

In the present embodiment, the electromagnetic portion 112 can be disposed at a vertex position of at least one alumina crystal. Namely, in the central support element 110, a number of the electromagnetic portion 112 can be single, and can be two or plural.

In the present embodiment, the electromagnetic portion 112 is disposed on a vertex position of at least one of the cone segments. Namely, when a number of the electromagnetic portion 112 is one, the electromagnetic portion 112 is required to be disposed on the vertex position of one of the cone segments of the central support element 110. When a number of the electromagnetic portion 112 is two or plural, the two or plural electromagnetic portions 112 can be disposed on vertex positions of two cone segments of the central support element 110.

The present embodiment disposes the electromagnetic portion 112 at the vertex positions of the cone segments of the central support element 110 such that after the LED chip 100 falls into the target position of the target substrate 200, the LED chip 100 can be rotated to a specific angle or orientation by applying a magnetic field for convenience of later processing the LED chip 100 and improve processing uniformity and a display effect.

Figure 3:
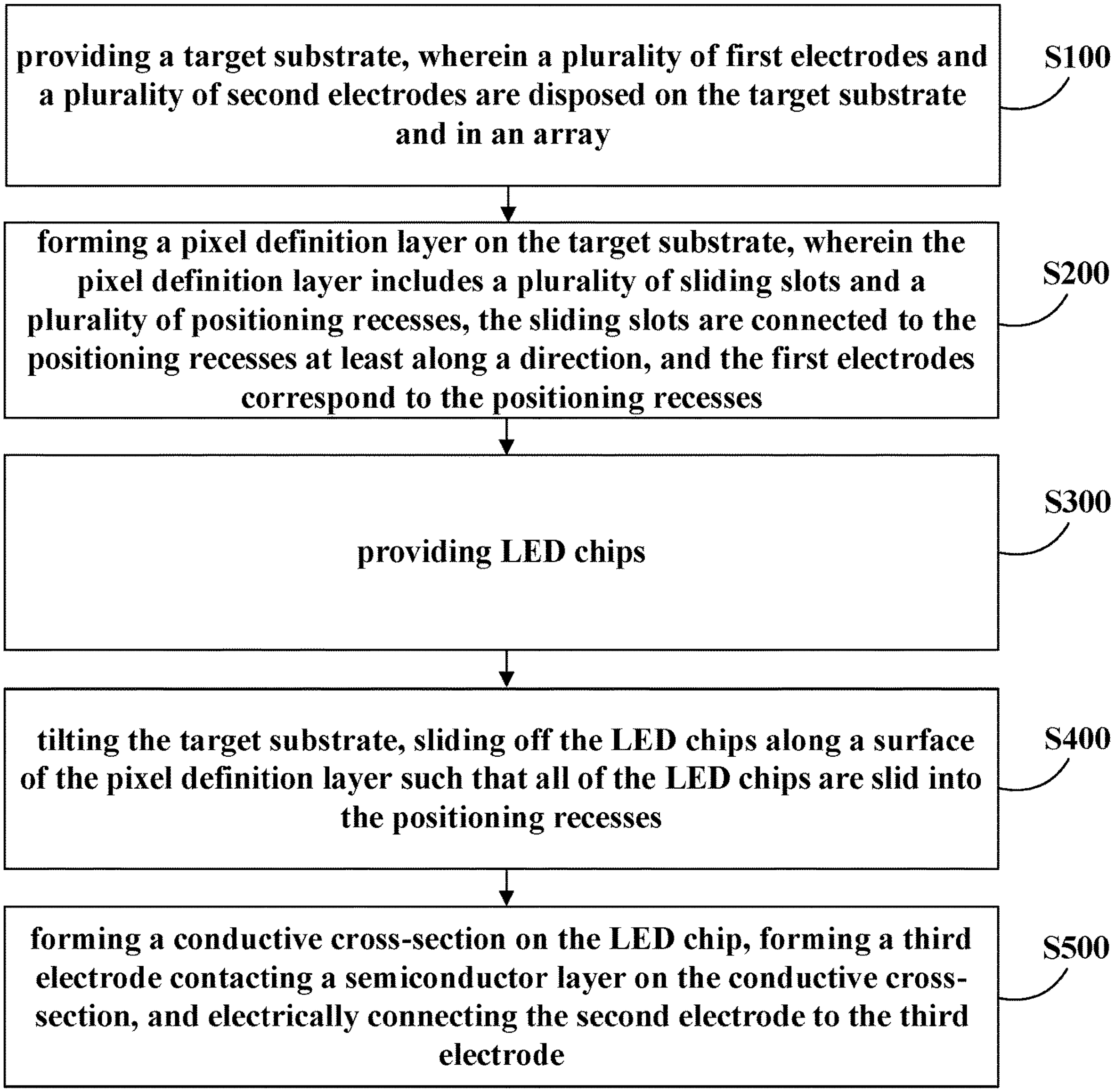
FIG. 3 is a flowchart of a display panel manufacturing method of the present application.

With reference to FIGS. 3 to 11, the present application further provides a display panel manufacturing method, FIG. 3 is a flowchart of the display panel manufacturing method of the present application.

The display panel manufacturing method can include steps as follows:

A step S100 includes providing a target substrate 200, wherein a plurality of first electrodes 410 and a plurality of second electrodes 420 are disposed on the target substrate 200 and in an array.

A step S200 includes forming a pixel definition layer 300 on the target substrate 200, wherein the pixel definition layer 300 includes a plurality of sliding slots 320 and a plurality of positioning recesses 310, the sliding slots 320 are connected to the positioning recesses at least along a direction 310, and the first electrodes 410 correspond to the positioning recesses 310.

A step S300 includes providing the LED chips 100 of above embodiment.

A step S400 includes tilting the target substrate 200, sliding off the LED chips 100 along a surface of the pixel definition layer 300 such that all of the LED chips 100 are slid into the positioning recesses 310.

A step S500 includes forming a conductive cross-section 430 on the LED chip 100, forming a third electrode 440 contacting a semiconductor layer 120 on the conductive cross-section 430, and electrically connecting the second electrode 420 to the third electrode 440.

The present embodiment provides the target substrate 200 preset with the first electrodes 410 and the second electrodes 420 (with reference to FIGS. 8 and 11), then disposes the pixel definition layer 300 on the substrate, and disposes the positioning recesses 310 on corresponding to the first electrodes 410 in position the pixel definition layer 300 such that the massive spherical LED chips 100 can roll along the sliding slots 320 in the pixel definition layer 300 into the positioning recesses 310 and then electrically connect the first electrodes 410 and the second electrodes 420 to achieve light emitting functions. Such process not only achieves an objective of highly efficient mass transfer of the LED chips 100 but also has no issue of misalignment of liquid carrying and covering, and therefore can effectively improve a transfer yield rate of the LED chips 100.

Figure 4:
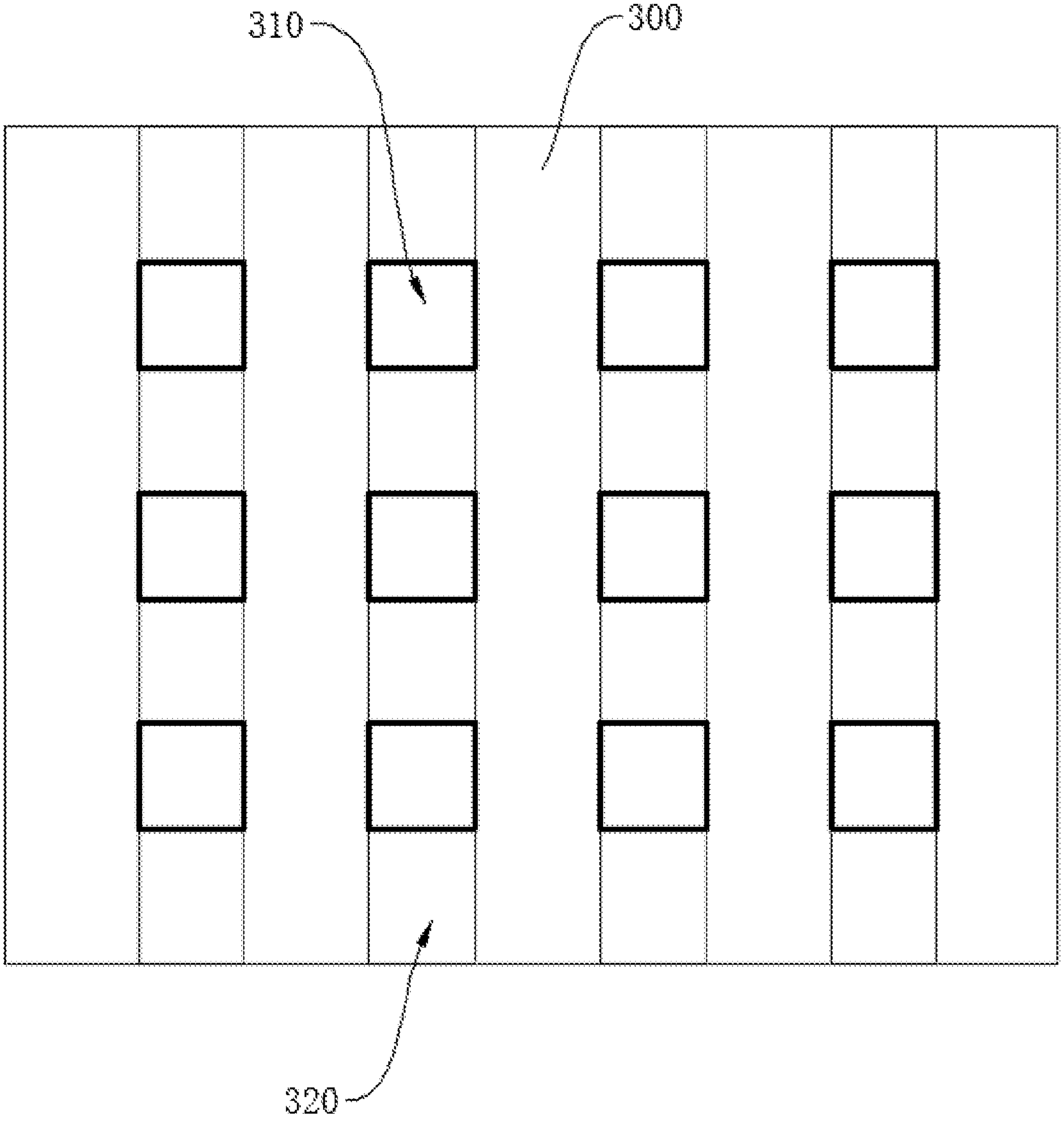
FIG. 4 is a first plane schematic view of a pixel definition layer of the present application.

With reference to FIG. 4, FIG. 4 is a first plane schematic view of a pixel definition layer of the present application, and the step S100 can include the following step:

A step S110 includes providing an underlay, forming an array driving layer (not shown) on the underlay. The array driving layer can include a plurality of thin film transistors, a plurality of the first electrodes 410, and a plurality of the second electrodes 420 disposed in an array.

In the present embodiment, the thin film transistors can serve as a pixel control switch of the display panel. each of the first electrode 410 and the second electrode 420 can serve as one of a cathode and an anode of the light emitting device of the display panel.

In the present embodiment, the first electrode 410 and the second electrode 420 are substantially positive and negative electrode terminals for bonding the target substrate and the LED chip in a common LED display panel. Therefore, a circuit structure connected to the first electrodes 410, the second electrodes 420 in the array driving layer can be designed referring to the circuit structure in the common LED display panel, and the present embodiment has no repeated description here.

The present embodiment forms an array driving layer including the first electrodes 410 and the second electrodes 420 on the underlay in advance. After the LED chip 100 is transferred to the target substrate 200 and is electrically connected to the first electrode 410, the second electrodes 420, each of the first electrode 410 and the second electrode 420 can serve an anode/cathode of the LED chip 100 to supply a voltage required by the LED chip 100 for light emission. In the present embodiment, because the anode and the cathode of the LED chip 100 are on the target substrate 200 made in advance, an initial state of the LED chip 100 can be made as a sphere, which provides the LED chip 100 with an excellent rolling characteristic to further achieve spontaneous roll of the LED chip 100 on the target substrate 200 to the target position and improves transfer efficiency and yield rate of the massive LED chips 100.

Figure 5:
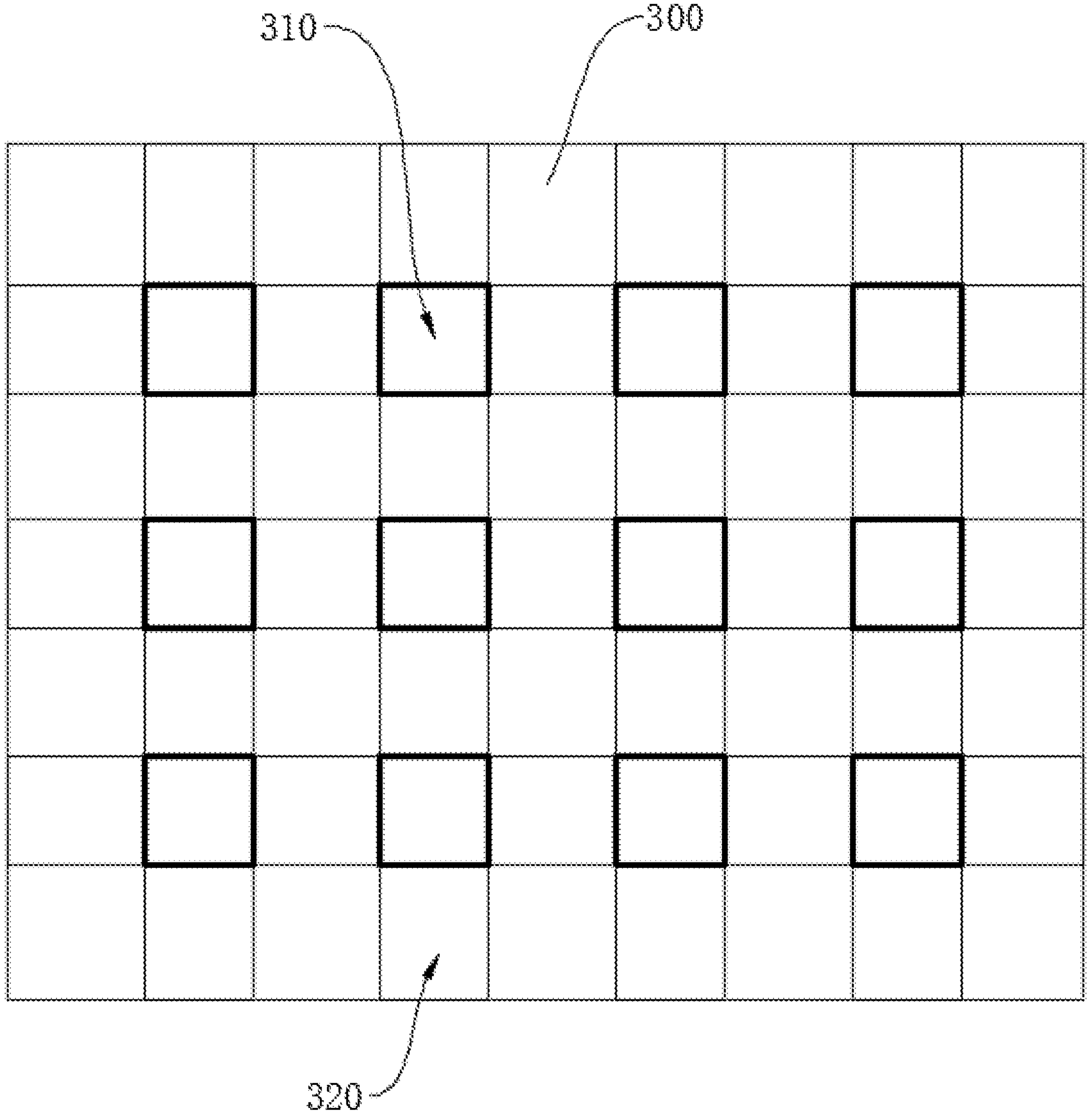
FIG. 5 is a second plane schematic view of the pixel definition layer of the present application.

With reference to FIGS. 4 and 5, FIG. 5 is a second plane schematic view of the pixel definition layer of the present application. In the display panel manufacturing method of the present application, the step S200 can include steps as follows:

A step S210 includes forming the pixel definition layer 300 on the target substrate 200, wherein the pixel definition layer 300 can be a photoresist material layer.

A step S220 includes forming the positioning recesses 310 disposed in an array in the pixel definition layer 300 by etching such that the first electrodes 410 are located in the positioning recesses 310.

In the present embodiment, the first electrodes 410 and the second electrodes 420 can be disposed on the target substrate 200 in the same layer or in different layers. However, the first electrodes 410 and the second electrodes 420 should be insulated from each other.

In the present embodiment, the first electrode 410 can be disposed in a recess bottom surface of the positioning recess 310 such that the conductive portion 130 can directly contact the first electrode 410 for electrical connection after the LED chip 100 is slid into the positioning recess 310.

A step S230 includes forming the sliding slots 320 in the pixel definition layer 300 by etching, wherein the sliding slots 320 are connected to the positioning recesses at least along a direction 310.

In the present embodiment, the sliding slots 320 can be disposed along a first direction and arranged along second direction, and the first direction is perpendicular to the second direction.

In the present embodiment, the first direction can be a row/column direction along which the positioning recesses 310 are arranged, and the second direction can be a column/row direction along which the positioning recesses 310 are arranged.

In the present embodiment, the positioning recesses 310 of each row/column can communicate with one another through one of the sliding slots 320 such that the LED chip 100 roll into each of the positioning recesses 310 in the row/column through the sliding slot 320.

In the present embodiment, the sliding slots 320 can be intersected in the pixel definition layer 300, namely, some of the sliding slots 320 are disposed along the first direction and arranged along the second direction, some other of the sliding slots 320 are disposed along the second direction and arranged along the first direction. At this time, the positioning recesses 310 are located at node point positions of intersecting locations of the sliding slots 320.

The present embodiment disposes the pixel definition layer 300 of the photoresist material on the target substrate 200 and forms the positioning recesses 310 and the sliding slots 320 by etching the pixel definition layer 300 to create conditions for directional rolling and falling of the spherical LED chips 100 on the target substrate 200, which achieves highly efficient transfer of the massive spherical LED chips 100 on the target substrate 200.

With reference to FIGS. 1 and 2, in the display panel manufacturing method of the present application, the step S300 can include steps as follows:

A step S310, includes providing a plurality of spherical or sphere-like alumina crystals, the alumina crystals are the central support elements 110 in the LED chips 100 of the above embodiment.

In the present embodiment, the spherical alumina crystals can be spherical surface sapphire substrate wafer (PSS Wafer), i.e., the LED circular crystals (also called sapphire crystal particles).

In the present embodiment, the sphere-like alumina crystals can also be composed of sapphire crystal particles of two cone structures, bottom surfaces of the sapphire crystal particle of the two cone structures coincide with each other and vertices of the sapphire crystal particle are away from each other to form polygonal pyramid crystal particles symmetrical relative to the bottom surfaces of the sapphire crystal particles.

A step S320 includes forming a semiconductor layer 120 on a surface of the alumina crystal with the semiconductor layer 120 completely covering the alumina crystal.

In the present embodiment, the semiconductor layer 120 can include an N-type gallium nitride semiconductor crystal material (n-GaN) and a P-type gallium nitride semiconductor crystal material layer (p-GaN).

In the present embodiment, the N-type gallium nitride semiconductor crystal material layer needs to serve the spherical/sphere-like alumina crystal as a nucleus for growth. The P-type gallium nitride semiconductor crystal material layer continues to grow and form on a surface of the N-type gallium nitride semiconductor crystal material layer.

A step S330 includes forming a conductive layer on a surface of the semiconductor layer 120, wherein the conductive layer is the conductive portion 130 of the LED chip 100 in the above embodiment.

In the present embodiment, the conductive layer can be a conductive thin film layer or a conductive metal layer. The conductive thin film layer can be an indium tin oxide (ITO) material, and the conductive metal layer can be Cu, Al, Ag, etc.

In the present embodiment, the conductive layer can be formed on a surface of the semiconductor layer 120 by a liquid covering method.

The present embodiment, by a liquid covering method, forms a conductive metal layer on the surface of the semiconductor layer 120, and a surface tension of liquid can be used to gradually correct a sphere-like shape of the alumina crystal to a sphere shape such that a shape of the LED chip 100 more and more approaches a sphere to reduce a blocking effect to the rolling LED chip 100.

In the present embodiment, the spherical LED chips 100 formed by the above steps probably have a difference in size (spherical diameter). Therefore, before transferring the LED chips 100 to the target substrate 200, the present embodiment can also perform size filtering to the massive LED chips 100.

Figure 6:
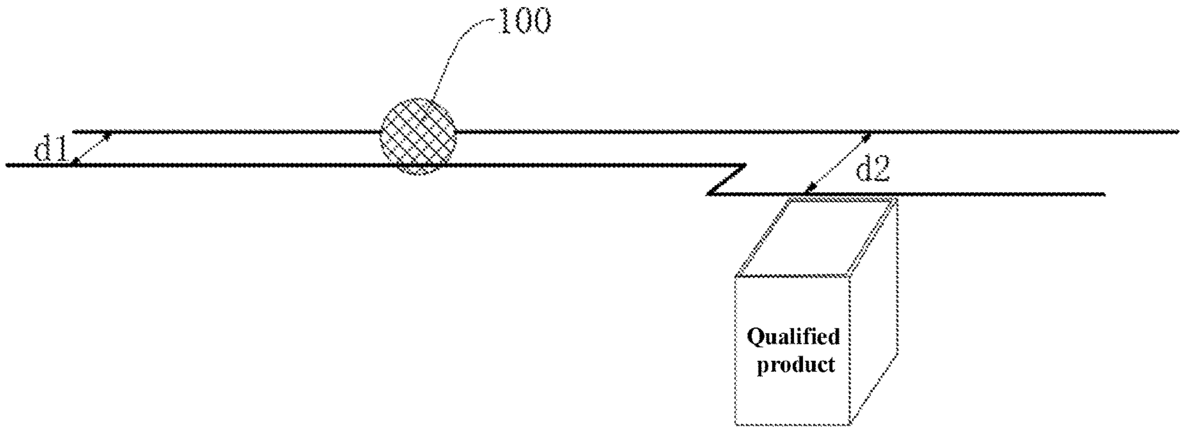
FIG. 6 is a schematic structural view of a guide rail of the present application for filtering the LED chips.

With reference to FIG. 6, FIG. 6 is a schematic structural view of a guide rail of the present application for filtering the LED chips. In particular, selection of a size of the LED chip 100 can include steps as follows:

(1) providing a guide rail composed of two parallel brackets (supporting rods) with a varying distance therebetween, wherein a distance between two parallel brackets in a first section of the guide rail is d1, a distance between two parallel brackets in a second section is d2, and d1 is less than d2.

(2) driving the spherical LED chip 100 of the above embodiment to roll from the first section to the second section of the guide rail. At this time, all of the LED chips 100 with diameters less than d1 would fall out from the first section (narrow section) and be filtered off, all of the LED chips 100 with diameters greater than d2 can continue to roll in the second section, and all of the LED chips 100 with diameters greater than d1 and less than d2 can fall out from second section (wide section) and be selected out.

The present embodiment, by the above filtering step, can select out the spherical LED chips 100 with qualified sizes having diameters from d1 to d2 and also can filter off substandard products with insufficient uniform shapes, which raises size uniformity of the spherical LED chips 100 to further improve light emitting uniformity of the LED chips 100 on the display panel.

It should be explained that the present embodiment has not confirmed or tested a growth situation of the semiconductor layer 120 in the alumina crystals in the step S320, namely, the present embodiment has not confirmed whether the semiconductor crystal material layer is attached on the alumina crystals. Therefore, a condition of the semiconductor crystal material layer not attached to the alumina crystals or the semiconductor crystal material layer having insufficient growth probably exists in the step S320, which probably results in liquid metal directly attached to the semiconductor layer 120 with an excessively thin thickness or the liquid metal directly attached to the alumina crystal. At this time, the sphere diameters of the LED chips with such quality issues would be apparently smaller than the sphere diameters of the qualified LED chips 100 such that the LED chips with such quality issues can be filtered off directly in the first section of the guide rail by the above filtering step.

Namely, the above filtering method can also skip a step of determining or testing a growth condition of the semiconductor layer 120 in the alumina crystals in the step S320 to effectively an efficiency of manufacturing and filtering the LED chips 100 with qualified sizes.

Figure 7:
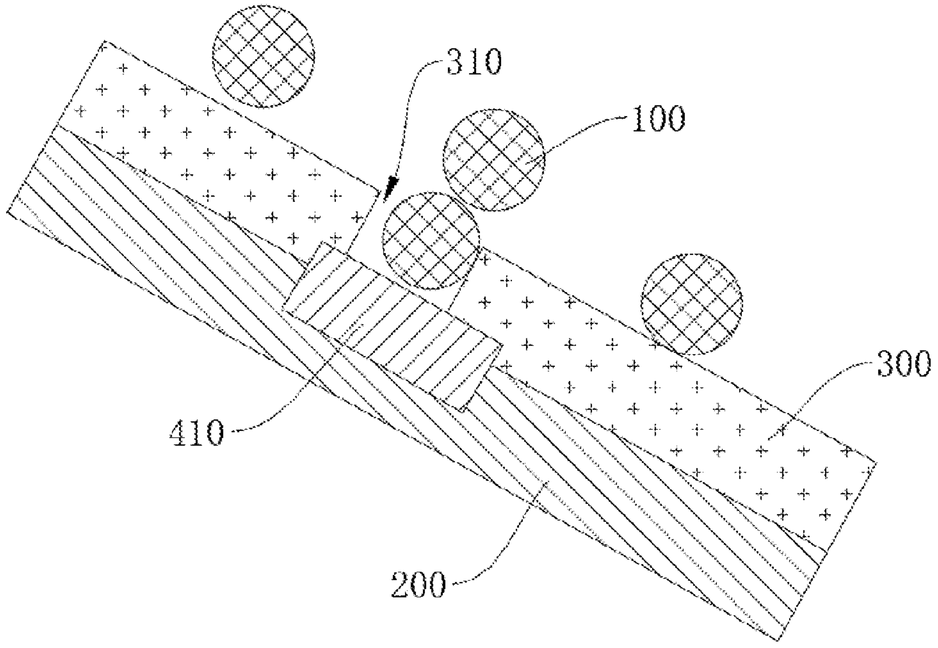
FIG. 7 is a schematic structural view of the LED chip of the present application rolling on the tilted target substrate.
Figure 8:
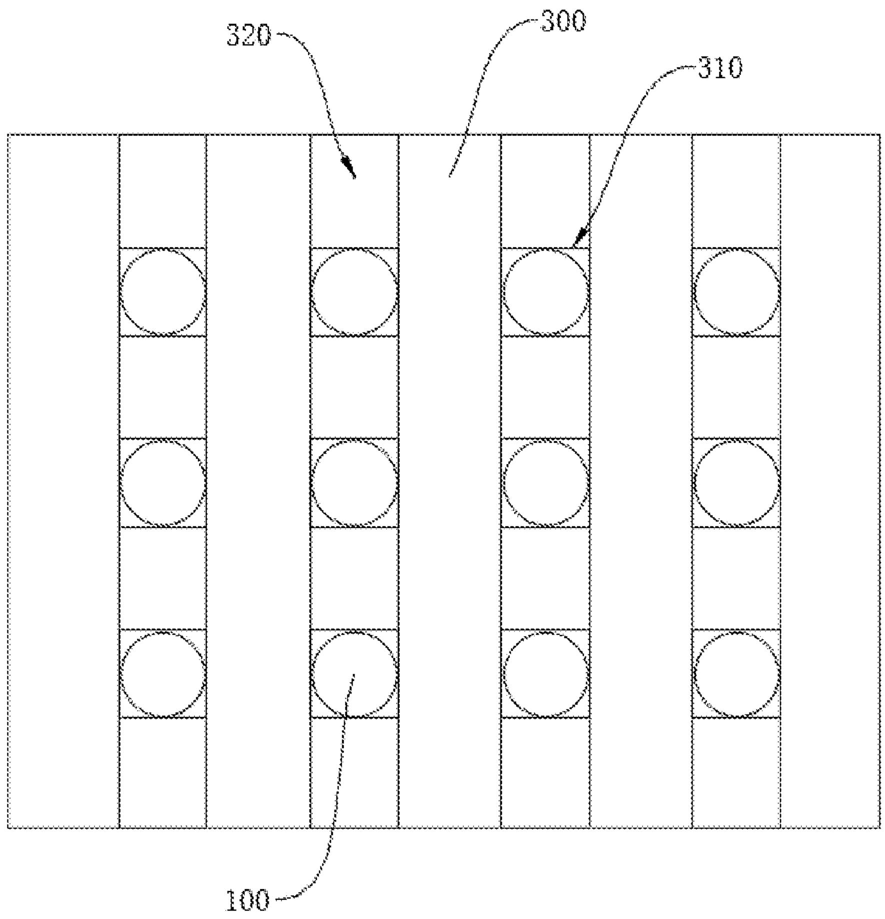
FIG. 8 is a schematic plane view of the LED chip of the present application on the horizontal target substrate.

With reference to FIGS. 7 and 8, FIG. 7 is a schematic structural view of the LED chip 100 of the present application rolling on the tilted target substrate 200. FIG. 8 is a schematic plane view of the LED chip 100 of the present application on the horizontal target substrate 200. In the display panel manufacturing method of the present application, the step S400 can include:

A step S410 includes tilting the target substrate 200, freely sliding off the LED chips 100 from a higher side of the target substrate 200 along the surface of the pixel definition layer 300 such that all of the LED chips 100 are slid into the positioning recesses 310.

In the present embodiment, a downward or upward tilt direction of the target substrate 200 can be consistent with extension directions of at least some of the sliding slots 320. Namely, when the sliding slot 320 extends along the first direction or the second direction, the tilt direction of the target substrate 200 is required to be consistent with the first direction or the second direction after tilt such that the spherical LED chip 100 can freely roll along the sliding slot 320 into the positioning recess 310 at the target position.

Figure 9:
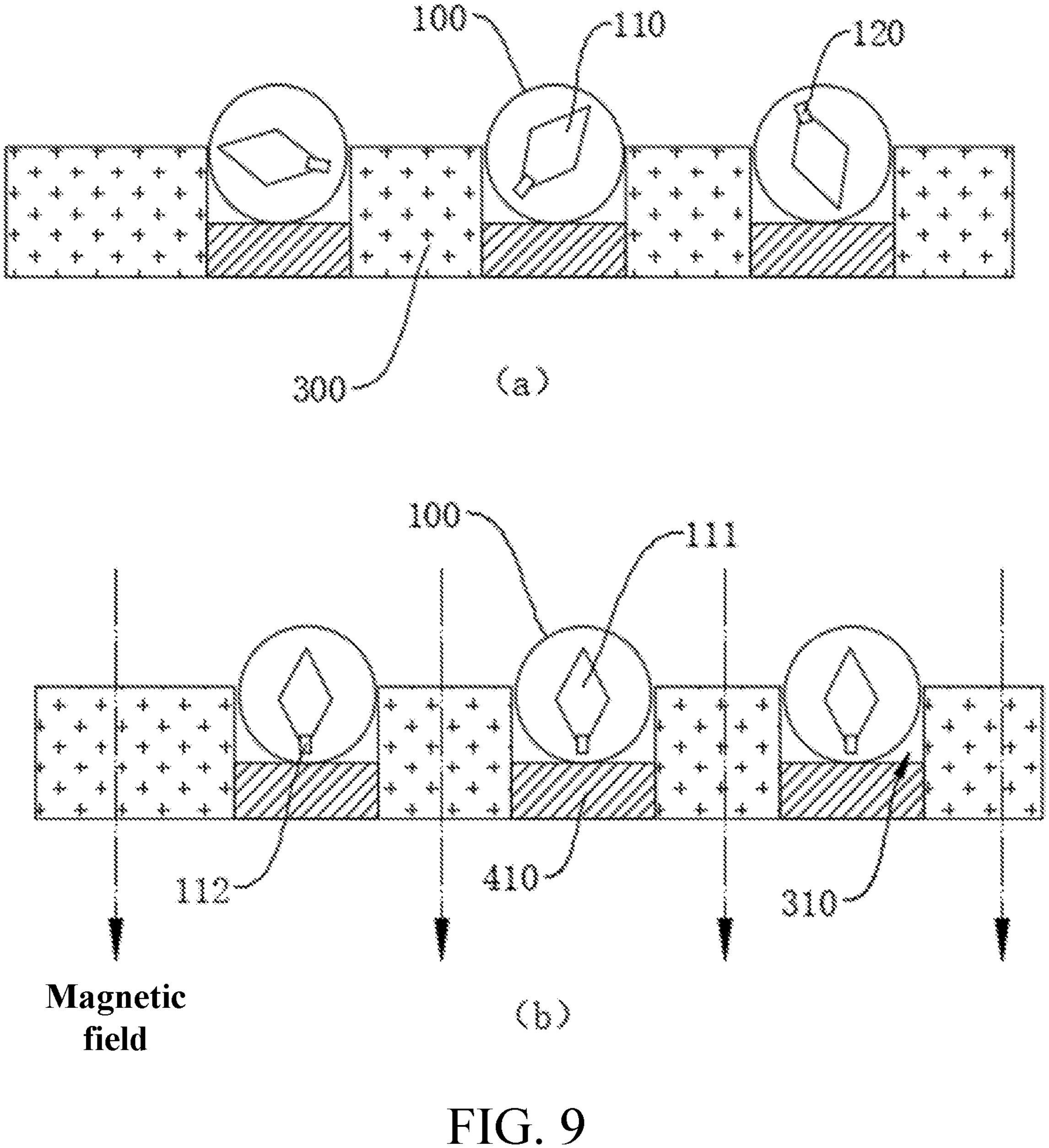
FIG. 9 is a schematic structural cross-sectional view of a pixel definition layer along a light exiting direction of the display panel of the present application.

With reference to FIG. 9, FIG. 9 is a schematic structural cross-sectional view of a pixel definition layer 300 along a light exiting direction of the display panel of the present application. In the present embodiment, along a light exiting direction of the display panel, a depth of the sliding slot 320 needs to fulfill a condition of the LED chip 100 rolling in the sliding slot 320 without falling out from the sliding slot 320. For example, the depth of the sliding slot 320 can be larger than or equal to half the diameter of the LED chip 100 such that at least half the sphere of the LED chip 100 is always located in the sliding slots 320 to lower a probability of the LED chip 100 disengaging from and falling out from the sliding slot 320. It should be explained that the present embodiment here only gives exemplary explanation to the above size comparison but has no specific limitation to a size relationship between the depth of the sliding slot 320 and the diameter of the LED chip 100.

In the present embodiment, along a light exiting direction of the display panel, a depth of the positioning recess 310 needs to fulfill that: the depth of the positioning recess 310 should be greater than a depth of the sliding slot 320, and when the LED chip 100 falls in the positioning recess 310, remaining spherical LED chips 100 can pass through a top of the positioning recess 310 without being captured and retained by the positioning recess 310. For example, the depth of the positioning recess 310 can be equal to and slightly greater than a diameter of the LED chip 100. Preferably, a vertex of the spherical surface of the LED chip 100 along the light exiting direction of the display panel can be flush with a recess opening of the positioning recess 310. It should be explained that the present embodiment only gives exemplary explanation by the above size proportions, but has no specific limitation to a size relationship of the depth of the positioning recess 310 and the diameter of the LED chip 100.

A step S420 includes applying a magnetic field to a periphery of the LED chip 100 such that the LED chip 100 rotates to make the electromagnetic portion 112 located on a side of the LED chip 100 near the first electrodes 410.

With reference to portions (a) and (b) of FIG. 9, in the present embodiment, the target substrate 200 carrying the LED chips 100 can be disposed in a certain constant and even magnetic field such that the LED chips 100 have magnetism and rotate under the magnetic field of the electromagnetic portion 112 to drive the LED chips 100 to rotate to make crystal particles of internal alumina crystals (namely, the central support elements 110) of cone structures orientated consistently. Namely, an orientation of the LED chip 100 is adjusted from a state of a portion (a) of FIG. 9 to a state of a portion (b) of FIG. 9 such that the massive LED chips 100 have isotropy in later processes on the target substrate 200 and the same parameters can be used to improve uniformity of later processes to the LED chips 100.

A step S430 includes enhancing strength of connection of the conductive portion 130 of the LED chip 100 with the first electrode 410.

In the present embodiment, a conductive adhesive material can be dropped in the positioning recess 310 to form a conductive adhesive 450, then a pressure is applied to the LED chip 100 such that the conductive adhesive material is cured to enhance bonding strength of the conductive adhesive 450. The LED chip 100 can be securely connected to the first electrode 410 through the conductive adhesive 450.

In the present embodiment, the conductive adhesive 450 can cover the first electrodes 410, and the conductive portion 130 of the LED chip 100 achieve stable fastening and electrical connection with the first electrodes 410 through the conductive adhesive 450.

It should be explained that the step S430 can also be implemented before the step 410. Namely, the conductive adhesive material can be dropped before the LED chip 100 rolls into the positioning recess 310, and apply a pressure to the LED chip 100 after the step S420 to make the conductive adhesive 450 cured such that blocking by the adhesive dropped to the LED chip 100 or light emitting defects of the LED chip 100 resulting from adhesive dropping can be prevented.

Figure 10:
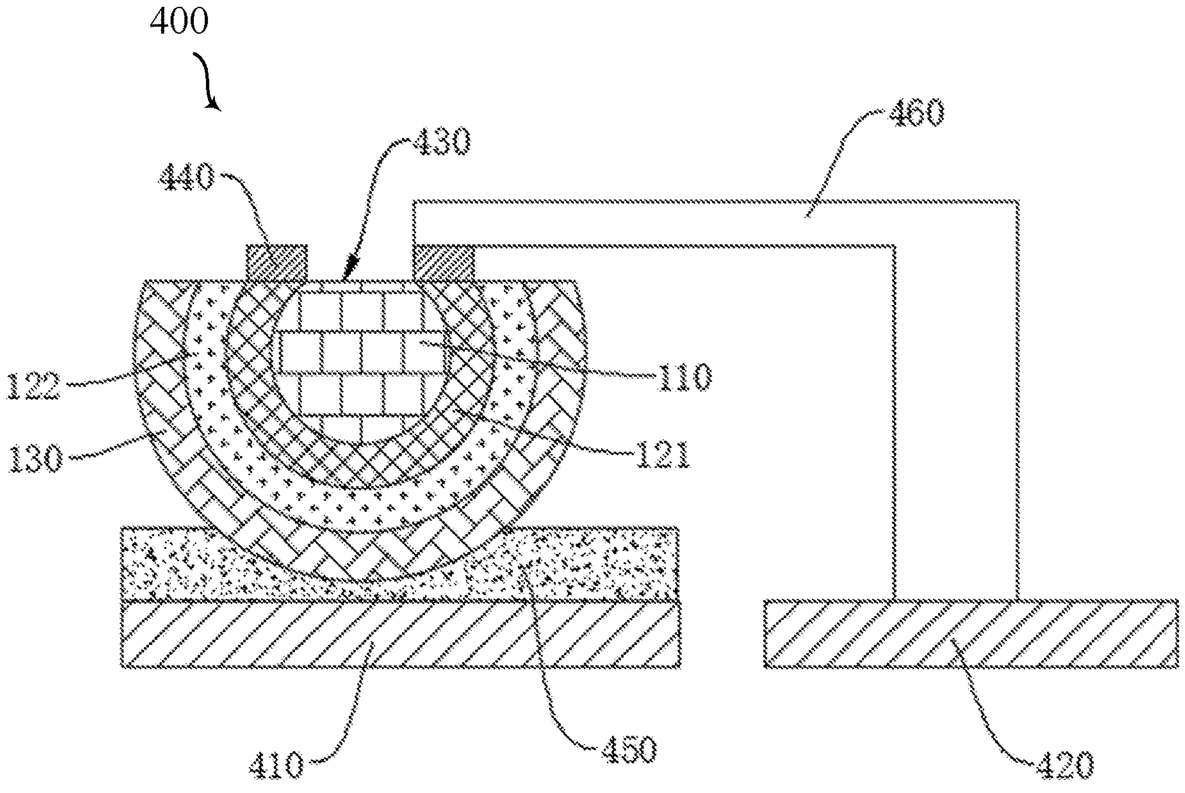
FIG. 10 is a schematic structural view of the entire LED chip of the present application processed as an LED light emitting device.
Figure 11:
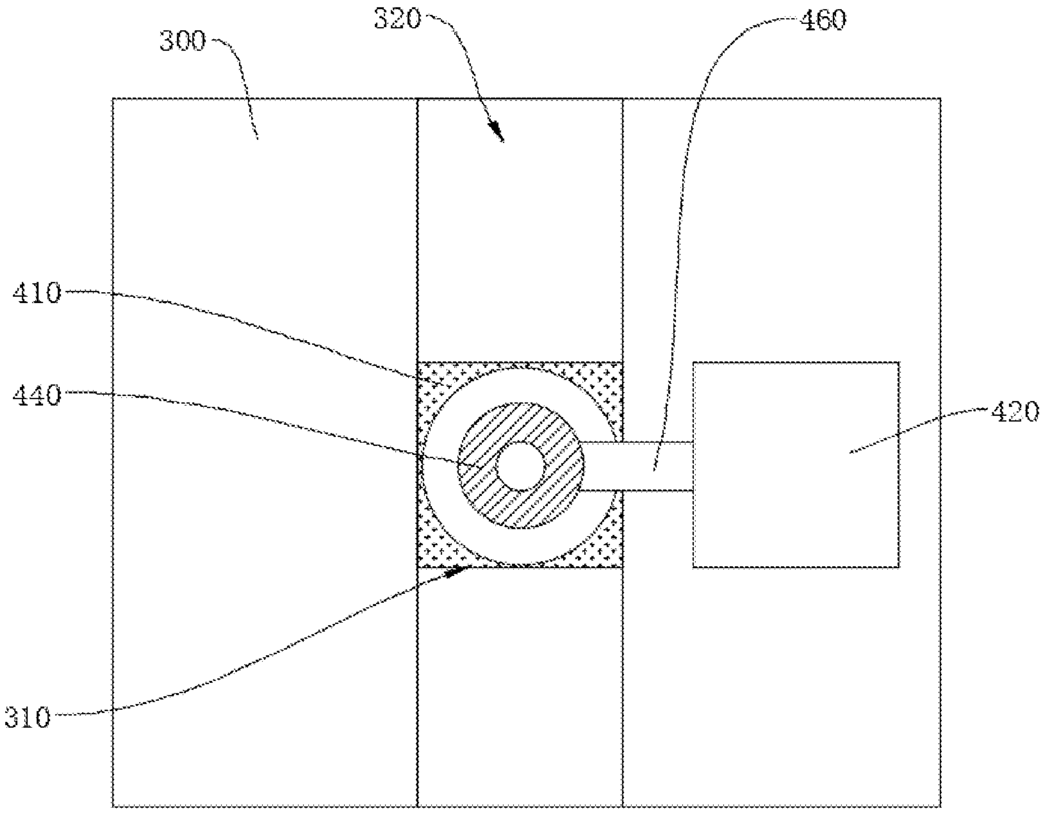
FIG. 11 is a plane structural view of the LED light emitting device of the present application on the target substrate.

With reference to FIGS. 10 and 11, FIG. 10 is a schematic structural view of the entire LED chip 100 of the present application processed as an LED light emitting device 400. FIG. 11 is a plane structural view of the LED light emitting device 400 of the present application on the target substrate. In the display panel manufacturing method of the present application, the step S500 can include steps as follows:

A step S510 includes forming a conductive cross-section 430 on the LED chip 100.

In the present embodiment, the pixel definition layer 300 and the massive LED chips 100 on the target substrate 200 can be etched in an entire surface such that the central support element 110 (alumina crystal) inside the LED chip 100 is exposed. At this time, an etched plane formed by etching the spherical LED chip 100 is the conductive cross-section 430.

A step S520 includes forming a third electrode 440 contacting the semiconductor layer 120 on the conductive cross-section 430.

In the present embodiment, because the conductive cross-section 430 is formed by etching an entire surface of the spherical LED chip 100, the semiconductor layer 120 can present a shape of a circular loop surrounding a periphery of the central support element 110 on the conductive cross-section 430.

In the present embodiment, a third electrode 440 can be formed on the conductive cross-section 430 corresponding to the N-type gallium nitride (n-GaN) semiconductor crystal material in the semiconductor layer 120 by a yellow light process. The third electrode 440 is an annular metal electrode.

A step S530 includes electrically connecting the second electrode 420 to the third electrode 440.

In the present embodiment, the third electrode 440 can be connected to the second electrodes 420 on the target substrate 200 by a metal bonding jumper 460. A first end of the metal bonding jumper 460 can be electrically connected to the annular third electrode 440, and a second end of the metal bonding jumper 460 can be electrically connected to the second electrode 420.

In the present embodiment, when the second electrodes 420 and the first electrodes 410 are disposed in different layers (the second electrodes 420 is disposed inside the array driving layer), the metal bonding jumper 460 can be electrically connected to the second electrode 420 through via holes formed in the pixel definition layer 300 and the array driving layer.

The present embodiment manufactures the third electrode 440 on the LED chip 100 by the above steps, and electrically connect the third electrode 440 to the second electrodes 420 through the metal bonding jumper 460, which can highly efficiently further process the massive LED chips 100 to the LED light emitting devices 400 on the display panel. Combining mass transfer and massive manufacturing of the LED light emitting devices 400 not only better improve a transfer efficiency of the massive LED chips 100 but also can enhance quality and efficiency of the LED light emitting devices 400 formed by the massive LED chips 100.

It should be explained that because the present embodiment applies a magnetic force of the electromagnetic field to the electromagnetic portion 112 in the step S420 to rotate all of the LED chips 100 to make the inside alumina crystal (namely, the central support element 110) crystal particles of cone structures orientated along the same direction such that the massive LED chips 100 have isotropy in later processes of the target substrate 200. Therefore, etching degrees of the step S510 to the massive LED chips 100 should be the same or consistent such that the massive LED chips 100 can be etched by the same parameters and the third electrodes 440 can be manufactured by the same parameters, which effectively improves an etching efficiency and a manufacturing yield rate of the third electrodes 440.

The embodiment of the present application further provides a display panel, and the display panel is manufactured by the above display panel manufacturing method.

With reference to FIGS. 9 to 11, the display panel can include a target substrate 200 and a pixel definition layer 300 and a plurality of LED light emitting devices 400 disposed on the target substrate 200. The target substrate 200 includes a plurality of first electrodes 410 and a plurality of second electrodes 420 disposed in an array. The pixel definition layer 300 includes a plurality of positioning recesses 310 disposed in an array. The first electrodes 410 correspond to the positioning recesses 310. The LED light emitting devices 400 are disposed in the positioning recesses 310. The LED light emitting devices 400 can include a central support element 110, a semiconductor layer 120 covering the surface of the central support element 110, and a conductive portion 130 covering the surface of the semiconductor layer 120. The conductive portion 130 is electrically connected to the first electrode 410. A side surface of the conductive portion 130 away from the semiconductor layer 120 is a spherical surface. A conductive cross-section 430 is disposed on the semiconductor layer 120 and configured to cut the spherical surface. A third electrode 440 is disposed on the conductive cross-section 430 and is electrically connected to the second electrode 420.

The present application disposes the positioning recesses 310 on the pixel definition layer 300 such that the LED light emitting devices 400 processed incompletely can roll in the positioning recesses 310 by their spherical shape. Then, the third electrode 440 is formed by a later process and is electrically connected to the second electrode 420 such that all manufacturing of the LED light emitting devices 400 is completed. The display panel in the present application uses the spherical LED chip 100 spontaneously rolling to the target position to achieve highly efficient LED mass transfer, and therefore can prevent issues of low transfer efficiency, poor yield rate, and high precision demand to a transferring apparatus in a conventional LED mass transfer technology.

Technical solutions of the present application are described with specific embodiments now. It should be explained that a descriptive order of the following embodiments has no limit to a preference order of the embodiment. In the present embodiment, the target substrate 200 of the display panel can be manufactured by the step S100 of the above display panel manufacturing method. The pixel definition layer 300 can be manufactured by the step S200. Because the step S100 and the step S200 have described the structures of the target substrate 200 and the pixel definition layer 300 respectively in detail, the present embodiment has no repeated description to the structures of the target substrate 200 and the pixel definition layer 300.

In the present embodiment, the LED light emitting devices 400 can be manufactured by the LED chip 100 in the step S300 processed by the step S500. Because the step S300 and the step S500 have described the structure of the LED chip 100 and the structured of the LED chip 100 processed completely in detail, the present embodiment has no repeated description to the structure of the LED light emitting device 400.

It should be explained that the LED chip 100 is processed by the step S420 (an electromagnetic field is applied such that the LED chips 100 rotate to make the crystal particles of the internal alumina crystal orientated consistently) such that at least one electromagnetic portion 112 in the LED light emitting devices 400 is located on a side of the LED light emitting devices 400 near the first electrodes 410.

With reference to FIGS. 9 and 10, in the present embodiment, along a light exiting direction of the display panel, a height of the LED light emitting devices 400 can be larger than or equal to a depth of the positioning recesses 310 such that the LED light emitting devices 400 can be flush with a surface of the pixel definition layer 300 or protrude from the surface of the pixel definition layer 300, to reduce a light shielding effect of the pixel definition layer 300 to the LED light emitting devices 400 to further improve brightness.

In the present embodiment, in a top view of the display panel, the shape of the positioning recess 310 can include but is not limited to circle, square, hexagon, etc. A size of the positioning recess 310 in the top view of the display panel fulfills being slightly greater than a sphere diameter of the LED light emitting devices 400 such that one positioning recess 310 can only accommodate one LED light emitting device 400, which improves display uniformity.

The embodiment of the present application disposes the positioning recesses 310 in an array arrangement on the pixel definition layer 300 of the target substrate 200 such that the spherical LED chips 100 can automatically rolling off into the positioning recesses 310, and be formed LED light emitting devices 400 able to emit light by later processes, which not only achieves highly efficient transfer of the massive LED chips 100 but also lowers a transfer cost of the massive LED chips 100 and achieves a better transfer yield rate, which improve light emitting intensity of LED light emitting devices 400 of the display panel and improves a display effect.

The LED chip 100, the display panel thereof, and the manufacturing method thereof provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. A light emitting diode (LED) chip, comprising:

a central support element;

a semiconductor layer covering a surface of the central support element; and a conductive portion covering a surface of the semiconductor layer;

wherein a side surface of the conductive portion away from the semiconductor layer is a spherical surface;

wherein the central support element comprises a main body portion and an electromagnetic portion;

wherein the main body portion comprises two cone segments disposed symmetrically, bottom surfaces of the two cone segments coincide with each other.

2. The LED chip according to claim 1, wherein the electromagnetic portion is disposed at a vertex position of at least one of the cone segments.

3. The LED chip according to claim 2, wherein the conductive portion comprises an opaque conductive metal layer.

4. A display panel manufacturing method, comprising:

providing a target substrate, wherein a plurality of first electrodes and a plurality of second electrodes are disposed on the target substrate in an array;

forming a pixel definition layer on the target substrate, wherein the pixel definition layer comprises a plurality of sliding slots and a plurality of positioning recesses, the sliding slots are connected to the positioning recesses at least along a direction, and the first electrodes corresponds to the positioning recesses;

providing LED chips, wherein each of the LED chips comprises a central support element, a semiconductor layer covering a surface of the central support element, and a conductive portion covering a surface of the semiconductor layer, wherein a side surface of the conductive portion away from the semiconductor layer is a spherical surface, wherein the central support element comprises a main body portion and an electromagnetic portion, wherein the main body portion comprises two cone segments disposed symmetrically, bottom surfaces of the two cone segments coincide with each other, wherein the electromagnetic portion is disposed at a vertex position of at least one of the cone segments, wherein the conductive portion comprises an opaque conductive metal layer; and tilting the target substrate, sliding off the LED chips along a surface of the pixel definition layer such that all of the LED chips are slide into the positioning recesses; and forming a conductive cross-section on the LED chip, forming a third electrode contacting the semiconductor layer on the conductive cross-section, and electrically connecting the second electrode to the third electrode.

5. The display panel manufacturing method according to claim 4, wherein the step of tilting the target substrate, sliding off the LED chips along the surface of the pixel definition layer such that all of the LED chips are slide into the positioning recesses comprises:

tilting the target substrate, freely sliding off the LED chips from a higher side of the target substrate along the surface of the pixel definition layer such that all of the LED chips are slide into the positioning recesses;

applying a magnetic field to a periphery of the LED chip such that the LED chip rotates to make the electromagnetic portion oriented to a side of the LED chip near the first electrode; and enhancing strength of connection of the conductive portion of the LED chip with the first electrode.

6. The display panel manufacturing method according to claim 4, wherein the step of forming the conductive cross-section on the LED chip and forming the third electrode contacting the semiconductor layer on the conductive cross-section comprises:

etching an entire surface of the pixel definition layer such that the central support element of the LED chip is exposed, and forming the conductive cross-section cutting the spherical surface of the conductive portion; and forming the third electrode covering the semiconductor layer on the conductive cross-section.

7. A display panel, comprising:

a target substrate comprising a plurality of first electrodes and a plurality of second electrodes arranged in an array;

a pixel definition layer disposed on the target substrate, wherein the pixel definition layer comprises a plurality of positioning recesses arranged in an array, and the first electrodes correspond to the positioning recesses; and a plurality of LED light emitting devices disposed in the positioning recesses, wherein the LED light emitting device comprises a central support element, a semiconductor layer covering a surface of the central support element, and a conductive portion covering a surface of the semiconductor layer, and the conductive portion is electrically connected to the first electrode;

wherein a side surface of the conductive portion away from the semiconductor layer is a spherical surface, a conductive cross-section is disposed on the semiconductor layer and is configured to cut the spherical surface, and a third electrode is disposed on the conductive cross-section and is electrically connected to the second electrode;

wherein a central support element of the LED light emitting devices comprises a main body portion and an electromagnetic portion;

wherein the main body portion comprises two cone segments disposed symmetrically, bottom surfaces of the two cone segments coincide with each other.

8. The display panel according to claim 7, wherein the electromagnetic portion is disposed at a vertex position of at least one of the cone segments.

9. The display panel according to claim 8, wherein the electromagnetic portion is located on a side of the LED light emitting devices near the first electrodes.

10. The display panel according to claim 7, wherein the display panel further comprises a conductive adhesive layer disposed between the first electrode and the LED light emitting device.

11. The display panel according to claim 10, wherein the conductive adhesive layer is securely bonded to the conductive portion of the first electrode and the LED light emitting device.

12. The display panel according to claim 7, wherein the pixel definition layer further comprises a plurality of sliding slots, and the sliding slots are connected to the positioning recesses at least along a direction.

13. The display panel according to claim 12, wherein along a light exiting direction of the display panel, a depth of the sliding slot is less than a depth of the positioning recess.

14. The display panel according to claim 13, wherein the depth of the sliding slot along the light exiting direction of the display panel is greater than or equal to half a depth of a diameter of the LED chip.

15. The display panel according to claim 12, wherein along a light exiting direction of the display panel, a height of the LED light emitting device is larger than or equal to a depth of the positioning recess.

16. The display panel according to claim 15, wherein a size of the positioning slot in a top view of the display panel is greater than or equal to a sphere diameter of the LED light emitting device.

* * * * *